United States Patent [19]
Conway et al.

[11] Patent Number: 5,394,122
[45] Date of Patent: Feb. 28, 1995

[54] RF DIGITAL-TO-ANALOG CONVERTER

[75] Inventors: Patrick H. Conway; David U. L. Yu, both of Rancho Palos Verdes, Calif.

[73] Assignee: Duly Research Incorporated, Rancho Palos Verdes, Calif.

[21] Appl. No.: 952,065

[22] Filed: Sep. 28, 1992

[51] Int. Cl.$^6$ .............................................. H03H 7/20
[52] U.S. Cl. ................................. 333/156; 333/81 R; 333/81 A; 327/237; 327/240; 327/308
[58] Field of Search ................ 332/106, 145; 333/18, 333/81 R, 156, 101, 81 A, 161; 341/144, 148; 328/104, 154

[56] References Cited
U.S. PATENT DOCUMENTS

| | | | |
|---|---|---|---|
| 4,266,201 | 5/1981 | Belfatto | 332/106 |
| 4,333,063 | 7/1982 | Ryu et al. | 333/18 |
| 4,494,084 | 1/1985 | Hughes | 333/81 R |
| 4,581,595 | 4/1986 | Silagi | 333/81 R |
| 4,870,374 | 9/1989 | Harris | 332/145 |
| 5,019,793 | 5/1991 | McNab | 333/156 |

Primary Examiner—John S. Heyman
Attorney, Agent, or Firm—Irving Keschner

[57] ABSTRACT

A digital-to analogue converter for producing an RF output signal proportional to a digital input word of N bits from an RF reference input, N being an integer greater or equal to 2. The converter comprises a plurality of power splitters, power combiners and a plurality of mixers or RF switches connected in a predetermined configuration.

5 Claims, 6 Drawing Sheets

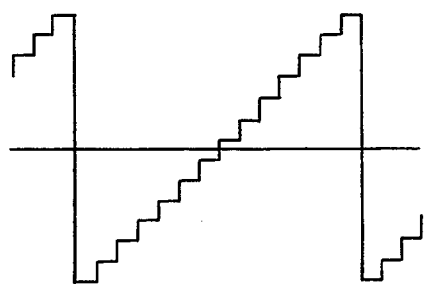
FIG.4a
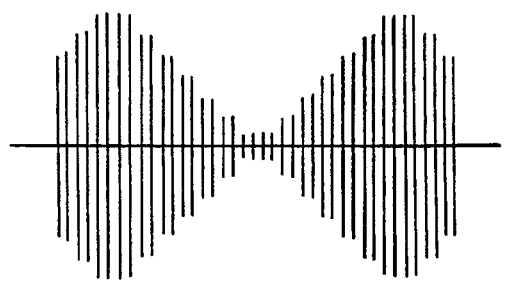
FIG.4b
FIG.4c
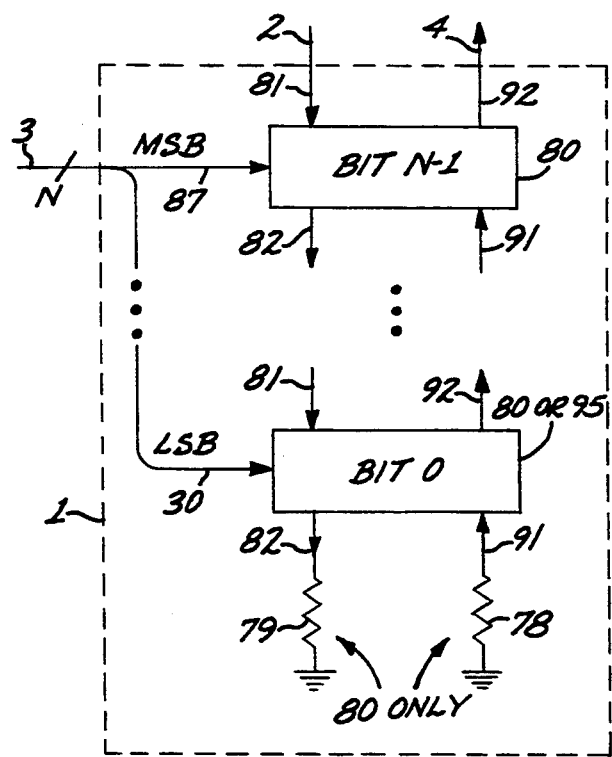
FIG.5

RF DIGITAL-TO-ANALOG CONVERTER

GOVERNMENT RIGHTS IN INVENTION

This invention was made with Government support under Small Business Innovation Research (SBIR) Grant No. DE-FG03-90ER80907 awarded by the Department of Energy to DULY Research, Inc., a California Corporation, also known as DULY Consultants. The Government has certain rights in the invention.

BACKGROUND OF THE INVENTION

1. Field of the Invention

The present invention comprises an apparatus for directly converting digital word input signals to RF voltage, the value depending on the state of the input. No intermediate analog circuitry is used. The RF DAC may be used to implement programmable attenuators and programmable phase shifters.

2. Problem to be Solved

Implementation of a high-speed (e.g. clock rates of over 100 MHz to over 1 GHz) programmable RF attenuator or phase shifter is beyond the state of the art with currently available components such as DACs, varactor diodes, PIN diodes and transistors, e.g. FETs, in either the linear or switching mode. Schottky diodes possess the properties of high-speed switching and attainable drive requirements; thus it is perceived to apply them to the problem. This results in an apparatus which produces the processed RF directly without intermediate analog steps.

3. Description of the Prior Art

Conventional DACs operate on direct voltage or current (DC) in converting digital word signals to baseband analog signals. For pulsed or continuous-wave (CW) applications involving radio-frequency (RF) signals, such as in a phase or amplitude modulator, a control signal is first generated with a conventional DAC and then passed on to an RF signal processor (for example, a varactor diode phase shifter, or a PIN diode or FET attenuator). DC DACs are expensive and require high power. The state of the art of conventional DAC is epitomized by the TriQuint TQ6112M which settles to 1% in 1 nanosecond.

Examples of analog RF signal processors are varactor diodes, PIN diodes and FETs. Varactor diodes, whose capacitance depends on the applied reverse voltage, are used as phase shifters. PIN diodes, whose resistance depends on the value of forward current, may be used as attenuators. Field-effect transistors (FETs), whose resistance depends on the value of the gate voltage, may also be used as attenuators. The varactor and PIN diodes have slow (greater than 1 nanosecond) response times. The response speed is limited by the device itself as well as the speed of the driver. In addition, they require high power to drive high capacitance and low impedance. The drivers themselves have response times of several nanoseconds.

FETs are easier to drive, but still have slow response times in analog circuits. Examples of FET attenuators are the HARRIS HMR-11000 (3-ns typical response time) and the HP HMMC-1001 (1-ns response time).

BRIEF DESCRIPTION OF THE DRAWING

These and other more detailed and specific objects will be disclosed in the course of the following specification, reference being made to the accompanying drawings, in which:

FIG. 4a, b and c illustrate associated waveforms;

FIG. 5 illustrates a simplified block diagram of an N-bit RF DAC;

DESCRIPTION OF THE PREFERRED EMBODIMENT

General Description

Figure 1:
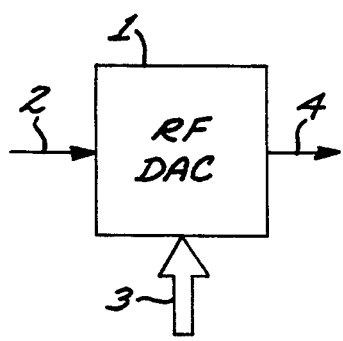
FIG. 1 illustrates the RF DAC block.

FIG. 1 shows the RF DAC I in block form wherein an RF input signal on lead 2 is applied and an RF output signal on lead 4 is obtained whose output is dependent on the state of the digital input signed on lead 3. While the input 2 may be modulated (pulse, sine wave, etc.) the following discussion will be based on a RF sine wave of constant root-mean-square (rms) voltage. This is a multiplying DAC since the output signal on lead 4 is proportional to the product of the RF input signal on lead 2 and the weighted state of the digital input 3.

While characteristic impedances and input and output impedances of RF circuits can be of any value, a value of 50 $\Omega$ is presumed in the following descriptions.

Component Descriptions

Figure 2A:
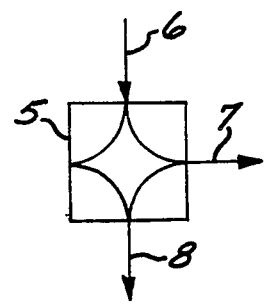
FIG. 2a, b, c, d and e (illustrates the component schematics of the devices used in the RF DAC.

FIG. 2a shows the schematic symbol of a power splitter 5 which divides the power input signal on lead 6 evenly between the outputs on lead 7 and 8. Thus, the outputs on lead 7 and 8 are 3 dB down (plus insertion loss) from the input on lead 6, whereby (for no insertion loss) the output voltage on lead 7 and the output voltage on lead 8 are identical and equal to 0.7071 times the input voltage on lead 6. The output voltages are in-phase with the input, except for small corrections.

Figure 2B:
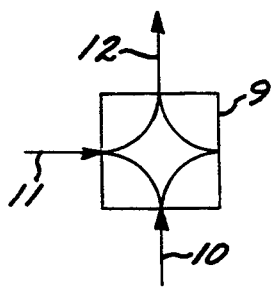

FIG. 2b shows the schematic symbol of a power combiner 9 which combines (sums) the power at the input leads 10 and 11 and produces it at the output lead 12 such that the output voltage equals 0.7071 times the vector sum of the input voltages, not accounting for insertion losses.

This invention concerns input phases of 0° or 180° and corresponding output phases of 0° or 180° ($\leq$ small phase errors), although the application is valid for any phase relationship. There is some intrinsic power loss for unequal input voltages which is dissipated in a resistor in the combiner circuit as can be shown by working examples. This is of no consequence since in this application the output voltage is the parameter of interest.

Figure 2C:
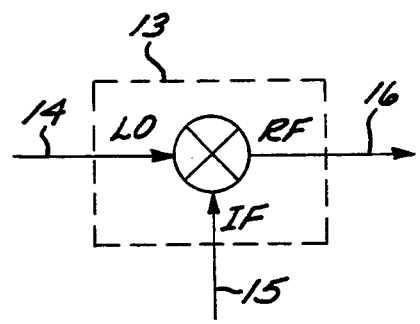

FIG. 2c shows the schematic symbol of a RF mixer 13. In this application it is used as a bi-phase modulator which produces an output on lead 16 either in-phase or 180° out-of-phase ($\leq$ small phase errors) with the input on lead 14 according to the state of the digital input on lead 15. In this application the mixer's local oscillator (LO) input port is used as the RF input 14, the radio frequency (RF) input port is used as the RF output 16 and the intermediate frequency (IF) output on lead port is used as the digital input 15. The output 16 is typically 2-8 dB down from the input on lead 14.

Figure 2D:
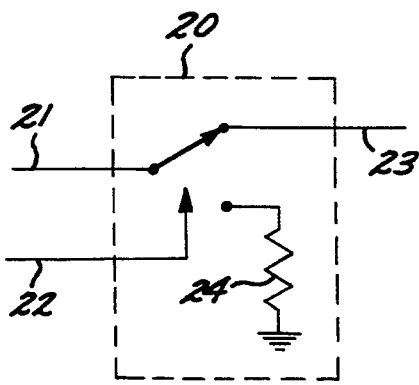

FIG. 2d shows the schematic of an RF switch 20. The RF output on lead 23 is equal to the RF input on lead 21 minus insertion loss or zero plus feed-through, depending on the state of the digital input on lead 22. While switches could be used in lieu of mixers, the following discussion is based on the use of mixers.

Figure 2E:
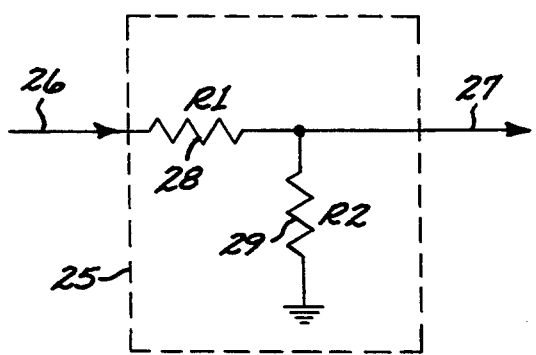

FIG. 2e shows the schematic of an attenuator network 25. The resistor values R1 28 and R2 29 are chosen so that the impedance on input lead 26 is 50 Ω with the output on lead 27 loaded with 50 Ω for any value of attenuation. The values are determined by the following equations:

The gain A = output voltage/input voltage, where $A \leq 1$. R1 = 50 Ω times $(1-A)$; R2 equals 50 Ω times $A/(1-A)$; R2/R1 = 2500 A.

RF DAC DESCRIPTION

Figure 3:
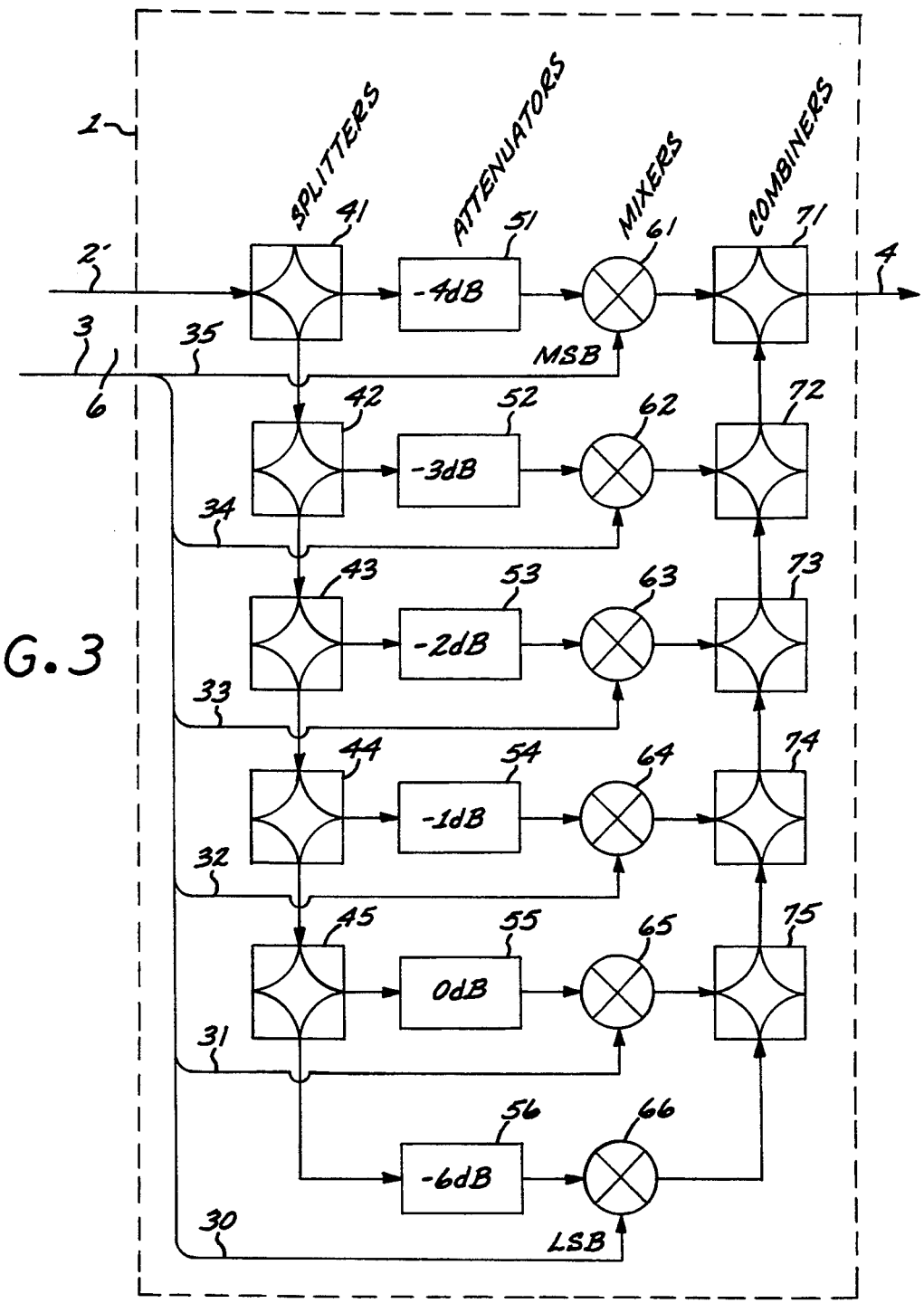
FIG. 3 illustrates a block diagram of a 6-bit RF DAC.

A block diagram of a 6-bit mechanization of the RF DAC 1 is shown in FIG. 3. The bits are binary weighted as in conventional DACs. Each bit contributes 6 dB less than the bit of next higher significance to the output on lead 4. In this example the weights of the bits are assumed to be $\leq 5$ mV, $\leq 10$ mV, $\leq 20$ mV, $\leq 40$ mV, $\leq 80$ mV and $\leq 160$ mV, from the least-significant bit to the most-significant bit, respectively. For example, the LSB contributes $-5$ mV to the output when it is LO ($=0$) and $+5$ mV when it is HI ($=1$) (or vice versa), etc., if the DAC is implemented with mixers used as bi-phase modulators. If switches are used in lieu of mixers the weights are positive or negative, not $\leq$, and, for example, the LSB will contribute zero or 5 mV to the output, etc.

The RF input on lead 2 is applied to a cascaded splitter chain, the outputs of each splitter being 3 dB down from the input, starting with the MSB. Thus, the outputs from splitters 41-45 are $-3$ dB, $-6$ dB, $-9$ dB, $-12$ dB and $-15$ dB, respectively, not accounting for insertion losses.

The splitter chain outputs are applied to attenuators 51-56. In the case of zero insertion losses the values of attenuation would be 0 dB (A=1), except for attenuator 56 which would be 6 dB.

The attenuator 51-56 outputs are applied to the RF inputs of mixer 61-66. Each mixer output is 3 dB down from the previous, starting from the MSB, except for mixer 66 which is 6 dB down, assuming equal losses in all mixers. The phase of each mixer output is 0° or 180°, depending on the state of its digital input on lead 35-30. The mixer losses do not affect the binary weighting, since they are equal in all bit paths. The mixer losses appears as an insertion loss in the overall DAC.

The mixer outputs are applied to a cascaded combiner chain which produces the analog RF output on lead 4. Each combiner 71-75 introduces 3 dB attenuation in its inputs, assuming no insertion loss. Thus, the attenuation from each input to the output on lead 4 is 3 dB, 6 dB, 9 dB, 12 dB and 15 dB, starting from the MSB.

Since each bit-path has 6 dB greater loss than the previous, starting from the MSB, 3 dB due to the splitters plus 3 dB due to the combiners, binary-weighting results. An attenuation 56 of 6 dB is introduced in the LSB path since the splitter/combiner set is the same one as in the next higher significance path.

In order to prevent phase shift errors in each bit-path from affecting the accuracy of the output on lead 4, the propagation delays from the input on lead 2 to the output on lead 4 must be equal for all bit-paths. This is accomplished by laying out the circuitry for equal path lengths or delays for all bits.

Also, the digital inputs on lead 30-35 must be applied to the inputs of mixers 61-66 on the same time-line to prevent skewing of the bit transitions. Attenuators 51-56 are provided to compensate for splitter and combiner insertion losses and variations in splitter, mixer and combiner losses. Assuming 3.5 dB each splitter and combiner losses and equal mixer losses, attenuations of 6 dB, 0 dB, 1 dB, 2 dB, 3 dB and 4 dB in attenuators 56-51, respectively, result in the desired binary weighting. Actually, the gain of each attenuator is adjusted to compensate for variations in the other losses in each path. Note that the DAC insertion loss in addition to that due to mixer loss is equal to the insertion loss, including that of attenuator 51, of the MSB path (associated with bit 35).

The attenuators also compensate for small phase-shift differences in the bit-paths, as illustrated by the following examples. The cosine of 10° equals 0.98481, which corresponds to a loss of 0.133 dB. The cosine of 5° equals 0.99619, which corresponds to a loss of 0.033 dB. In calibrating the attenuators these effects will be taken into account.

To assure monotonicity the overall error at the output on lead 4 must be less than the weight of the LSB. For a 6-bit DAC with an LSB weight of $\leq 5$ mV an error of 5 mV or 7-bit monotonicity is satisfactory. Note that the granularity at the output on lead 4 is equal to 10 mV.

Operational waveforms are shown in FIG. 4. A staircase waveform is shown in FIG. 4a which is as the demodulated output would appear if the input on lead 3 were to be driven by a counter which counted from all 0's to all 1's and then rolled-over to all 0's, or vice versa, and repeated indefinitely. The voltage steps from a maximum negative value thru zero to a maximum positive value and then steps to a maximum negative value again, etc., (or vice versa). FIG. 4b shows the corresponding RF waveform on output 4 waveform. FIG. 4c shows that the RF output on lead 4 is of 0° phase for negative values of FIG. 4a and of 180° for positive values (or vice versa).

FIG. 5 is a block diagram more general in nature than that of FIG. 3 of the RF DAC 1 for N-bits. Practical values of N range from 2 to 12. Operation is the same as that of FIG. 3. The splitter chains are implemented by connecting each output lead 82 to the input lead 81 of the bit of next higher significance between bits. The combiner chains are implemented by connecting the output 92 to the input 95 of the bit of next higher Significance between bits. If the LSB is mechanized as shown in FIG. 6a 80 the output on lead 82 and the input 95 must be terminated in their characteristic impedances with resistors 78 and 79.

Figure 6A:
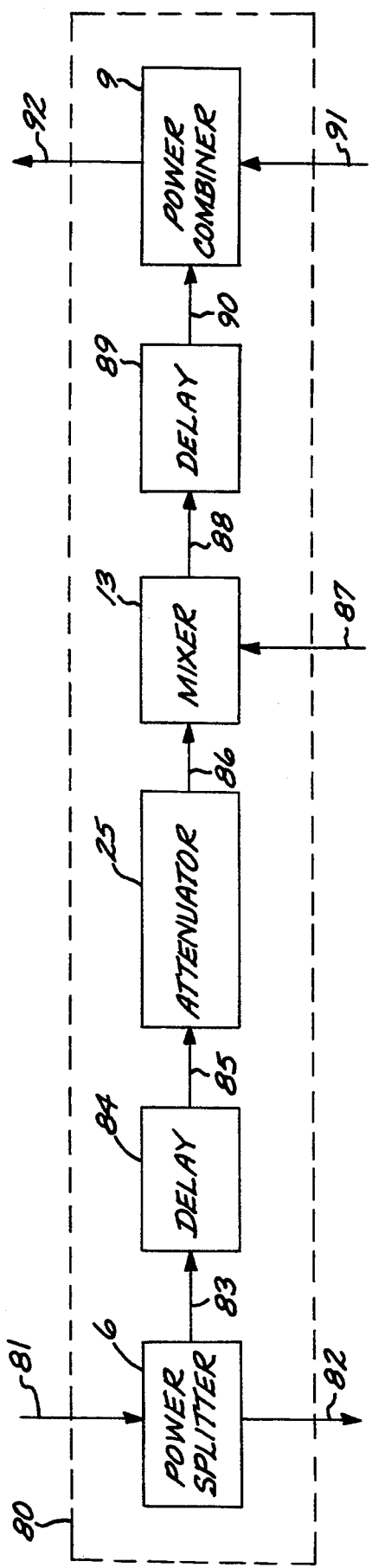
FIG. 6a and b illustrate the block diagram of the mechanization of each bit of the RF DAC.

FIG. 6a is a block diagram of each bit's mechanization 80 of FIG. 5. The splitter 6, the attenuator 25, the mixer 13 and the combiner 9 have been described above. Also mentioned above is the need for equal propagation delays in the RF DAC 1 from the RF input on lead 2 to the RF output on lead 4 via any bit-path and for the mixer's digital inputs on lead 87 (or lead 30 in FIG. 6b) to be on the same time-line, i.e., equal delays from the RF input on lead 2 to the mixer inputs on leads 87 or 30. The delay blocks 84 and 89 may be implicit or explicitly mechanized. Lead lengths may be designed for equal delays via any bit-path, resulting in the diamond-shaped layout shown in FIG. 7. The delay blocks 84 and 89 may be explicitly mechanized with fixed or adjustable delay lines.

If the LSB is mechanized as in FIG. 6a the nominal attenuation values of the attenuators 25 would be 0, 1, 2, 3 dB, etc., to N-1 dB, starting from the LSB, respectively, increasing 1 dB/bit for splitters and combiners of 3.5 dB loss each.

Figure 6B:
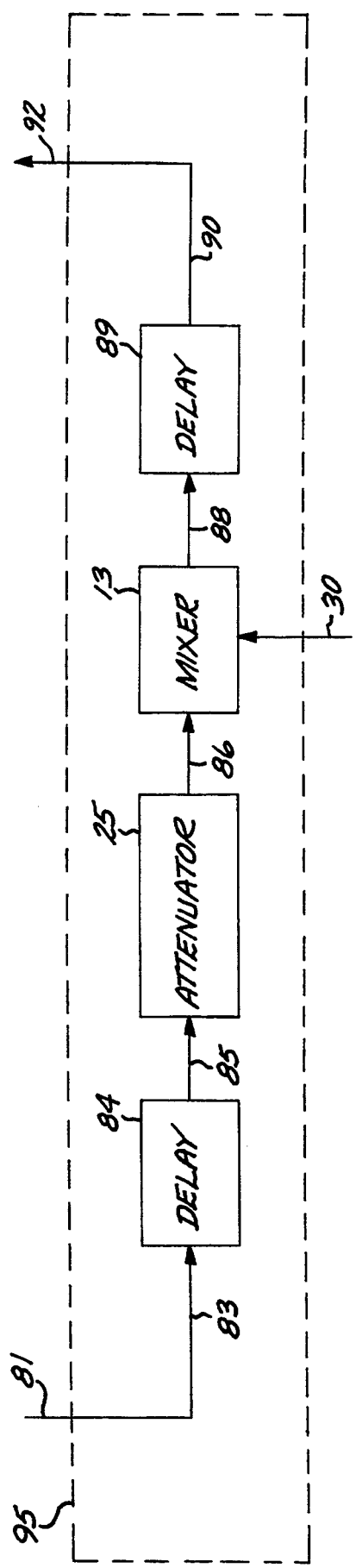
Figure 7:
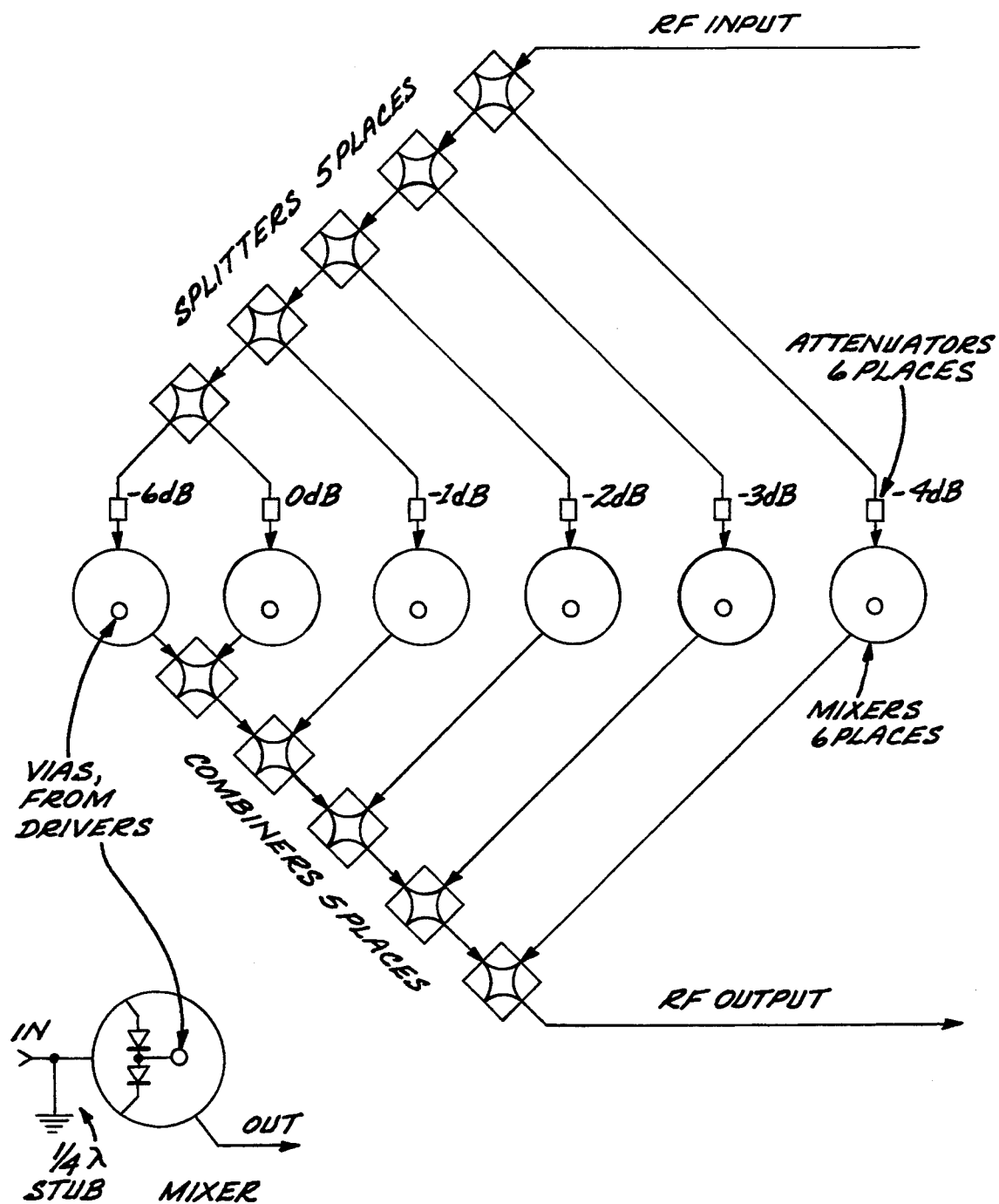
FIG. 7 illustrates the layout for equal delays in all paths.

An optional (preferred) mechanization for the LSB 95 is shown in FIG. 6b. The power splitter 6 and combiner 9 are eliminated and the RF input on lead 81 is applied directly to the input 83 of delay 84 and the RF output on lead 92 is taken from the output 90 of delay 89. The nominal attenuation values would be 6, 0, 1, 2, etc., to N-2 dB, starting from the LSB for the same conditions of the previous paragraph.

PROGRAMMABLE ATTENUATOR

Figure 8:
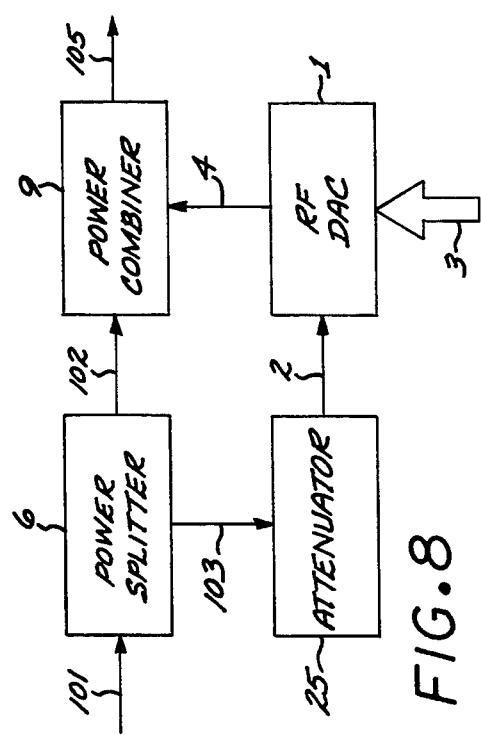
FIG. 8 illustrates the application of the RF DAC in a programmable attenuator.

The RF DAC 1 is inherently a programmable attenuator, producing a bi-phase output from a maximum absolute value to a very high level of attenuation. It can be used as illustrated in FIG. 8 to implement an attenuator with an output on lead 105 having a range 0 to −6 dB, for example, with a very low granularity, 0.1 dB, for example. The RF input on lead 101 is split by splitter 6 to drive combiner 9 and the RF DAC 1 input on lead 2 via attenuator 25. The attenuation level of attenuator 25 is designed so the maximum absolute value of voltage at the input lead 4 of combiner 9 is ½ the voltage applied to the combiner at input lead 102. Thus, the vector sum of the combiner's inputs produces an output on lead 105 from a maximum value to ½ the maximum value, in $2^N-1$ voltage steps as the RF DAC 1 voltage on output lead 4 is varied throughout its range. The equation relating the input and output of the combiner has been set forth above.

Note that while the volts/step is constant, the dB/step is greatest at the maximum attenuation level, decreasing as the attenuation decreases.

PROGRAMMABLE PHASE SHIFTER

Figure 9A:
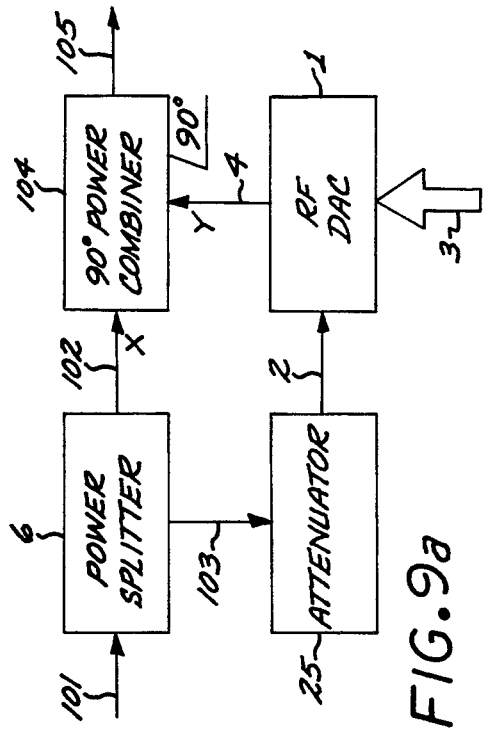
FIG. 9a and b illustrate the application of the RF DAC in a programmable RF phase shifter.

A programmable phase shifter is illustrated in FIG. 9a. The block diagram of FIG. 9a is identical to that of FIG. 8 except that combiner 9 is replaced with a 90° combiner 104. The operation of a 90° combiner is the same as that for a 0° combiner, except that one of the inputs is shifted 90°. While it is not essential to this invention which input is shifted 90°, assume for this example that the input on lead 4 to combiner 104 is shifted 90°. The attenuator is designed so that the maximum absolute value of voltage appearing on input lead 4 input 4 is ½ that (for example) on input lead 102. This results in an RF output on lead 105 which changes in phase as the DAC 1 output voltage on lead 4 is varied throughout its range with a maximum value of arctan (0.5), or ≦26.5°.

Figure 10:
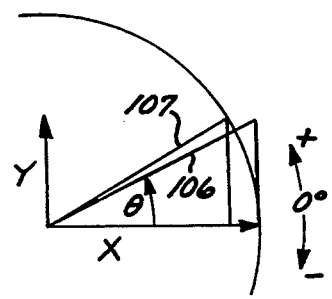
FIG. 10 illustrates the vector addition of a phase shifter.

This condition is illustrated in FIG. 10. Values are normalized such that the X input on lead 11 is equal to 1 volt. Input y on lead 4 varies throughout the range of ≦½ volt according to the RF DAC input 3.

The phase Θ of the output on lead 105 is equal to arctan(y) and the magnitude is equal to $\sqrt{(1+y^2)}$. The maximum value of Θ and its associated magnitude are illustrated in FIG. 10 by reference line 106.

PROGRAMMABLE PHASE SHIFTER WITH AMPLITUDE COMPENSATION

Note that in FIG. 10, the magnitude 106 is a function of Θ. To obtain a constant magnitude for all values of Θ, x as well as y must change as a function of Θ. In this case, the magnitude is normalized to 1 volt, Θ=arcsin(y) and $x=\sqrt{(1-y^2)}$. Thus, a programmable attenuator is required to produce the voltage x.

Figure 9B:
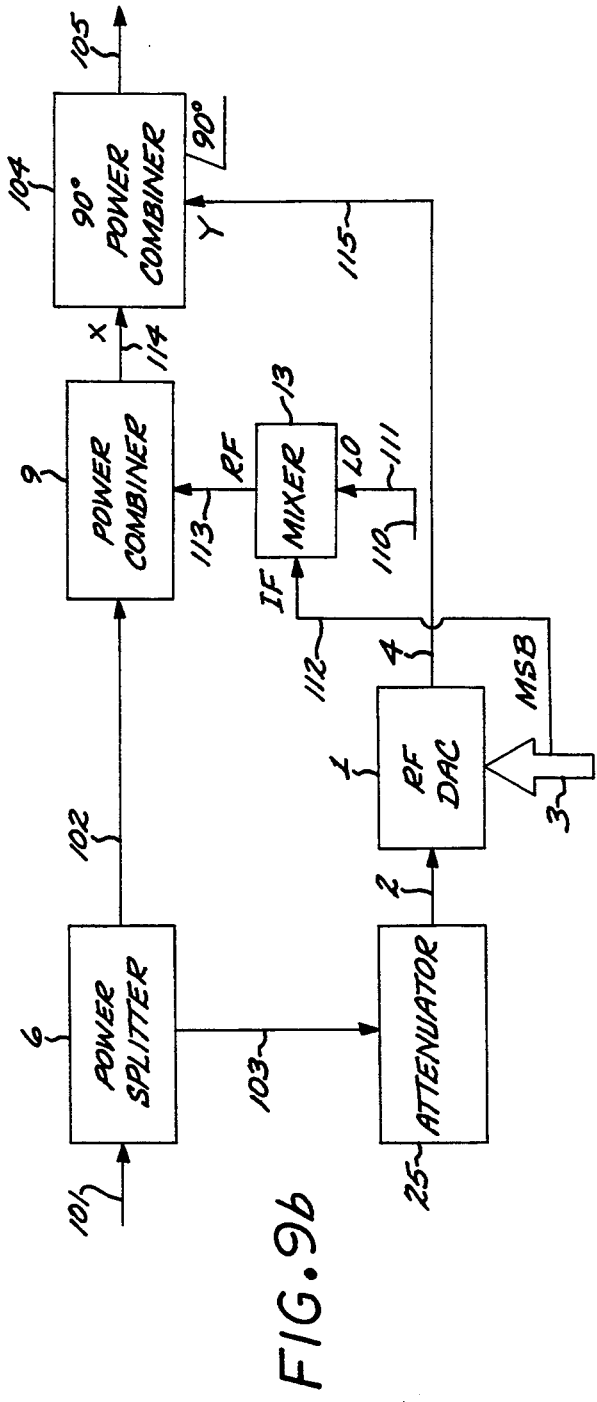

A mechanization which gives approximate amplitude compensation is illustrated in FIG. 9b. A small amount of the RF DAC 1 on output lead 4 is split off by directional coupler 110 which is then combined with the x input of 90° combiner 104 via combiner 9 and mixer 13. The mixer 13 is controlled by the MSB 112 of the RF DAC 1 digital input 3 such that the mixer 13 output and combiner input on lead 113 is 180° out-of-phase with the input on lead combiner 2 to 9 114, thus reducing the combiner 104 input x on lead 114 as the absolute value of Θ increases.

The output on lead 111 of directional coupler 110 can be selected to produce a magnitude of 1 at some value Θ. For a 7 dB directional coupler and a 6 dB mixer loss, the value of Θ at which this occurs is approximately 20°. The magnitude also equals 1 at Θ=0°. Thus, the magnitude is nearly constant for values of Θ in the range of ±25°.

What is claimed:

1. A digital-to-analog converter which produces an RF output signal proportional to a digital input word of N bits or from an RF reference input, N being an integer and greater or equal to 2, comprising:

A set of N-1 power splitters having first and second outputs, the input of the first power splitter being connected to said RF reference input, the first output thereof being connected to the input of the second power splitter and so on, the output of the N-2th power splitter being connected to the input of the N-1th power splitter, the second output of said first power splitter being less by X db then the input power of said RF reference input, the output of said second power splitter being at least X db less than the power in the input applied thereto and so on;

N devices having first and second inputs, the first output of said first power splitter being coupled to the first input of said first device and the first bit of said digital input word being coupled to the second input of said first device, the first output of said second power splitter being coupled to the first input of said second device and the second bit of said digital input word being coupled to the second input of said second device and so on, the first and second outputs of the N-1th power splitter being coupled to the first input of said N-1th and Nth devices, respectively, the devices operating on the associated power splitter outputs in accordance with the value of the digital bit applied thereto; and N-1 power combiners having first and second inputs, the output of said first device being connected to the first input of the first power combiner, the output of said second power combiner being connected to the second input of said first power combiner, and so on, the output of the Nth device being connected to the second input of said N-1 power combiner, the output of said first power combiner corresponding to said RF output signal.

2. The converter of claim 1 wherein said devices comprise mixers which pass the associated power splitter outputs either in-phase or 180° out-of-phase according to the state of the associated input digital bit.

3. A programmable RF attenuator which produces an attenuated RF output signal proportional to a digital input word of N bits from an RF reference input N is an integer and greater or equal to two, comprising:

A power splitter having an input for receiving said RF reference input, a first output thereof being coupled to an attenuator, a second output coupled to the first input of power combiner means, the output of said attenuator being connected to a set of N-1 power splitters, the input of the first power splitter being connected to the output of said attenuator, the output thereof being connected to the input of the second power splitter and so on, the output of the N-2 power splitter being connected to the input of the N-1th power splitter, the power output of said first power splitter being less by X db than the input power of said RF reference input, the output of said second power splitter being at least X db less than the power in the input applied thereto and so on;

N devices having first and second inputs, the output of said first power splitter being coupled to the first input of said first device and the first bit of said digital input word being coupled to the second input of said first device, the output of said second power splitter being coupled to the first input of said second device and the second bit of said digital input word being coupled to the second input of said second device and so on, the first and second outputs of the N-1th power splitter being coupled to the first input of said N-1 and Nth devices, respectively, the devices operating on the associated power splitter outputs in accordance with the value of the digital bit applied thereto; and N-1 power combiners having first and second inputs, the output of said first device being connected to the first input of the first power combiner, the output of said second power combiner being connected to the second input of said first power combiner, and so on, the output of the Nth device being connected to the second input of said N-1 power combiner, the output of said first power combiner being connected to the second input of said power combiner means, the output of said power combiner means corresponding to said attenuated RF output signal.

4. A programmable phase shifter which produces a phase shifted RF output signal proportional to a digital input word of N bits from an RF reference input N is an integer and greater or equal to two, comprising:

a power splitter having an input for receiving said RF reference input, a first output thereof being coupled to an attenuator, a second output coupled to the first input of power combiner means, the output of said attenuator being connected to a set of N-1 power splitters, the input of the first power splitter being connected to the output of said attenuator, the output thereof being connected to the input of the second power splitter and so on, the output of the N-2 power splitter being connected to the input of the N-1th power splitter, the power output of said first power splitter being less by X db than the input power of said RF reference input, the output of said second power splitter being at least X db less than the power in the input applied thereto and so on;

N devices having first and second inputs, the output of said first power splitter being coupled to the first input of said first device and the first bit of said digital input word being coupled to the second input of said first device, the output of said second power splitter being coupled to the first input of said second device and the second bit of said digital input word being coupled to the second input of said second device and so on, the first and second outputs of the N-1th power splitter being coupled to the first input of said N-1 and Nth devices, respectively, the devices operating on the associated power splitter outputs in accordance with the value of the digital bit applied thereto; and N-1 power combiners having first and second inputs, the output of said first device being connected to the first input of the first power combiner, the output of said second power combiner being connected to the second input of said first power combiner, and so on, the output of the Nth device being connected to the second input of said N-1 power combiner, the output of said first power combiner being connected to the second input of said power combiner means, a 90° phase shifter interposed between the output of said first power combiner and the input of said power combiner means, the output of said power combiner means corresponding to said phase shifted RF output signal.

5. A programmable phase shifter which produces a phase shifted RF output signal with amplitude compensation proportional to a digital input word of N bits from an RF reference input N is an integer and greater or equal to two, comprising:

a power splitter having an input for receiving said RF reference input, a first output thereof being coupled to an attenuator, a second output coupled to the first input of power combiner means, the output of said attenuator being-connected to a set of N-1 power splitters, the input of the first power splitter being connected to the output of said attenuator, the output thereof being connected to the input of the second power splitter and so on, the output of the N-2th power splitter being connected to the input of the N-1th power splitter, the power output of said first power splitter being less by X db then the input power of said RF reference input, the output of said second power splitter being at least X db less than the power in the input applied thereto and so on;

N devices having first and second inputs, the output of said first power splitter being coupled to the first input of said first device and the first bit of said digital input word being coupled to the second input of said first device, the output of said second power splitter being coupled to the first input of said second device and the second bit of said digital input word being coupled to the second input of said second device and so on, the first and second outputs of the N-1th power splitter being coupled to the first input of said N-1th and Nth devices, respectively, the devices operating on the associated power splitter outputs in accordance with the value of the digital bit applied thereto; and N-1 power combiners having first and second inputs, the output of said first device being connected to the first input of the first power combiner, the output of said second power combiner being connected to the second input of said first power combiner, and so on, the output of the Nth device being connected to the second input of said N-1th power combiner, the output of said first power combiner being connected to the second input of said power combiner means, a 90° phase shifter interposed between the output of said first power combiner and the input of said power combiner means, a directional coupler interposed between the output of said Nth power combiner and the input of said power combiner means, a RF mixer coupled to the output of said directional coupler which produces an output signal having a phase according to the state of the most significant bit of said digital input word, and a power combiner having a first input connected to the output of said power splitter and a second input connected to the output of said mixer, the output of said power combiner being connected to one input of said power combiner means, the output of said power combiner means corresponding to said phase shifted amplitude compensated RF output signal.

* * * * *